(12) United States Patent  
Servant et al.

(10) Patent No.: US 8,172,944 B2
(45) Date of Patent: May 8, 2012

(54) DEVICE FOR PRODUCING A BLOCK OF CRYSTALLINE MATERIAL WITH MODULATION OF THE THERMAL CONDUCTIVITY

(75) Inventors: Florence Servant, Grenoble (FR); Denis Camel, Chambery (FR); Benoit Marie, Grenoble (FR); Damien Ponthenier, Champagnier (FR)

(73) Assignee: Commissariat a l'Energie Atomique, Paris (FR)

( * ) Notice: Subject to any disclaimer, the term of this patent is extended or adjusted under 35 U.S.C. 154(b) by 888 days.

(21) Appl. No.: 12/216,420

(22) Filed: Jul. 3, 2008

(65) Prior Publication Data

US 2009/0013925 A1    Jan. 15, 2009

(30) Foreign Application Priority Data

Jul. 10, 2007    (FR) ...................... 07 04979

(51) Int. Cl.
*C30B 11/00*    (2006.01)
(52) U.S. Cl. ........................ 117/206; 117/223
(58) Field of Classification Search .............. 117/37, 117/39, 73, 81, 83, 206, 223, 910
See application file for complete search history.

(56) References Cited

U.S. PATENT DOCUMENTS

| | | | | |
|---|---|---|---|---|
| 3,898,051 A | * | 8/1975 | Schmid ............................ | 117/83 |
| 4,015,657 A | * | 4/1977 | Petrov et al. ................... | 164/361 |
| 8,057,598 B2 | * | 11/2011 | Cho et al. ....................... | 117/218 |
| 2003/0145782 A1 | * | 8/2003 | Kawase et al. ................... | 117/81 |
| 2006/0144326 A1 | | 7/2006 | Einhaus et al. | |
| 2007/0227769 A1 | * | 10/2007 | Brodsky et al. ................ | 174/264 |

FOREIGN PATENT DOCUMENTS

| | | |
|---|---|---|
| DE | 33 23 896 A1 | 1/1985 |
| EP | 0 141 999 A1 | 5/1985 |
| EP | 0141999 * | 5/1985 |
| EP | 0 889 148 A1 | 1/1999 |
| GB | 2 041 236 A | 9/1980 |
| JP | A-2001-048696 | 2/2001 |
| WO | WO 2004/094704 A2 | 11/2004 |

OTHER PUBLICATIONS

CRC Handbook of Chemistry and Physics, 91st Edition, "Thermal and Physical Properties of Pure Metals," p. 12-205 (2010-2011).*
CRC Handbook of Chemistry and Physics, 91st Edition, "Thermal Conductivity of Gases," p. 6-184 (2010-2011).*
The Engineering Toolbox, "Emissivity Coefficients of some common Materials," available at http://www.engineeringtoolbox.com/emissivity-coefficients-d_447.html and accessed Jul. 5, 2011.*

* cited by examiner

*Primary Examiner* — Michael Kornakov
*Assistant Examiner* — Kenneth A Bratland, Jr.
(74) *Attorney, Agent, or Firm* — Oliff & Berridge, PLC

(57) ABSTRACT

The device for producing a block of crystalline material from a bath of molten material comprises a crucible having a bottom and heat extraction means arranged under the crucible. It also comprises means for modulating the thermal conductivity fitted between the bottom of the crucible and the heat extraction means. The means for modulating the thermal conductivity comprise a plurality of plates made from thermally conducting material of low emissivity, parallel to the bottom of the crucible, and means for moving said plates closer to and away from one another.

17 Claims, 3 Drawing Sheets

US 8,172,944 B2

DEVICE FOR PRODUCING A BLOCK OF CRYSTALLINE MATERIAL WITH MODULATION OF THE THERMAL CONDUCTIVITY

BACKGROUND OF THE INVENTION

The invention relates to a device for producing a block of crystalline material from a bath of molten material, comprising a crucible having a bottom, heat extraction means arranged under the crucible, and means for modulating the thermal conductivity fitted between the bottom of the crucible and the heat extraction means.

STATE OF THE ART

Nowadays, production of photovoltaic cells is mainly performed from silicon, the silicon itself being mainly crystallized in furnaces of Czochralski or Bridgman type.

In a Bridgman-type configuration, heat is input to the crucible via the top or the sides and is extracted via the bottom. Heating of the furnace can be performed using several different approaches in particular by adjusting the heating power as the crystallization process progresses to make the silicon crystallization front advance in liquid phase.

A Bridgman-type furnace is particularly well-suited for producing silicon for the solar industry as it in particular enables multicrystalline ingots to be produced with columnar grains perpendicular to the crystallization front.

A Bridgman-type furnace also enables the heat flux extracted from the crucible to be controlled during the three phases of the production method:
melting of the silicon in the crucible,
initiation of growth,
crystallization of the ingot.

A Bridgman-type furnace further enables the material used to be purified by segregating the impurities which are then rejected in liquid phase. However, to purify the material to be solidified, the heat flux to be extracted has to be controlled to remain in morphological stability conditions of the solidification front, which may limit the solidification rate.

Moreover, when initiation of crystalline silicon growth takes place, the extracted heat flux also has to be progressively increased. If this is not the case, destabilization of the growth front takes place and prevents good segregation of the impurities in the silicon. In addition, growth initiation, or seeding, also requires control of the solidification rate, and therefore of the heat flux, to ensure a good grain structure.

Although Bridgman-type devices have numerous positive features, they do however present a certain number of drawbacks in particular as far as precise control of the temperature and of the heat exchanges throughout a molten silicon crystallization cycle is concerned.

European Patent no 141999 proposes to remove an insulating part located under the crucible, present when melting of the silicon takes place, to reduce the thermal insulation within the crucible. In this way, while keeping a constant heating power, a temperature reduction is then achieved by means of an increased heat release by radiation and solidification is performed. In this embodiment, heat extraction by radiation is not really controlled, as the insulating part under the crucible is either present or removed.

The document JP-A-2001048696 also describes cooling of molten silicon by progressively removing the insulation located under the crucible. In this document, temperature modulation is achieved by controlling the radiation. However, this embodiment does not enable the heat flux variation to be finely controlled.

As extraction of the heat flux from the molten material in the crucible by radiation therefore presents numerous drawbacks, heat flux extraction by conduction is generally preferred instead.

The document GB-A-2041236 describes the use of a graphite plug placed under the bottom of the crucible, which enables the thermal conductibility of the assembly to be increased thereby increasing heat extraction by conduction. However, this graphite plug being situated in the centre of the bottom of the crucible, it cools the central part of the crystal considerably. This embodiment therefore does not apply to fabrication of silicon ingots of consequent size, as the quantity of heat that has to be extracted varies according to the thermal resistance of the solid silicon, i.e. the thickness of silicon, to be passed through.

The document WO-A-2004094704 describes the use of a crucible mainly having heat extraction by radiation but whose device also uses modulation of heat extraction by conduction by means of compression of a graphite felt located under the crucible.

OBJECT OF THE INVENTION

The object of the invention consists in providing a device for producing a block of crystalline material that finely modulates heat extraction by conduction and that is easy to implement.

The device according to the invention is characterized in that the means for modulating the thermal conductivity comprise a plurality of plates made from thermally conducting material of low emissivity, parallel to the bottom of the crucible and means for moving said plates towards and away from one another and towards and away from the bottom of the crucible.

BRIEF DESCRIPTION OF THE DRAWINGS

Other advantages and features will become more clearly apparent from the following description of a particular embodiment of the invention given as a non-restrictive example only and represented in the accompanying drawings, in which.

DESCRIPTION OF A PREFERRED EMBODIMENT OF THE INVENTION

Figure 1:
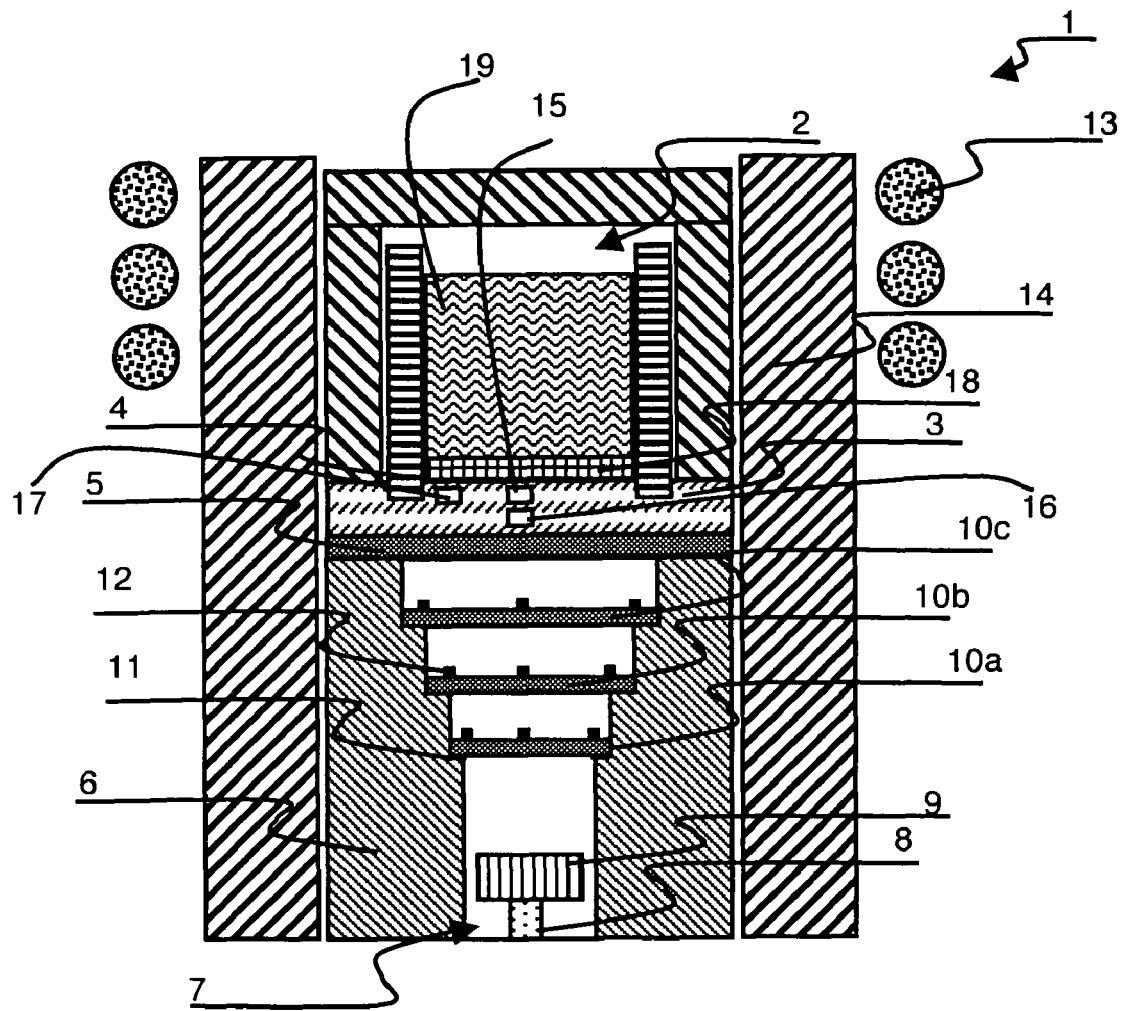
FIGS. 1 and 2 represent a schematic cross-sectional view of an embodiment of the device according to the invention respectively in the melting phase and in the crystallization phase.

As illustrated in FIG. 1, the Bridgman-type device 1 for producing blocks of crystalline material comprises a crucible 2 itself comprising a bottom 3 and side walls 4. The materials constituting crucible 2 are chosen such that most of the heat flux removed from crucible 2 is removed via bottom 3. The material of bottom 3 is therefore preferably a good thermal conductor compared with the other materials constituting crucible 2 so as to be able to extract the majority of the heat flux therefrom. Side walls 4 of crucible 2 are for example made from silica whereas bottom 3 of crucible 2 is made from graphite. The thickness of the bottom of the crucible is typically a few centimeters, for example 5 cm. Bottom 3 of the crucible is advantageously, at least partially, slightly slit on its external face (over a part of its thickness). The slit, while preserving the tightness of the bottom of the crucible, enables inductive coupling to be prevented in this part of the crucible, preventing overheating of the bottom of the crucible which could be detrimental to the seed.

To foster heat evacuation by conduction, the external face of bottom 3 of crucible 2 is advantageously covered or securely united with a layer of conduction material 5. This conduction material 5 presents a low emissivity, preferably less than or equal to 0.5, a high thermal conductivity, preferably greater than 10 $W \cdot m^{-1} \cdot K^{-1}$, and is resistant to high temperatures, typically a temperature higher than the melting temperature of the material to be solidified and even more typically higher than 1400° C. The layer of conduction material 5 is for example formed by a molybdenum film, with a thickness for example of 1 mm. It thus fosters extraction of the heat contained in crucible 2 by conduction rather than by radiation.

Crucible 2 can for example present a square, rectangular or round cross-section. If a crucible 2 of square cross-section is preferably used, the latter advantageously presents side walls 4 of about 200 mm. Crucible 2 can also present side walls with a dimension of up to 1 m.

Within device 1, crucible 2 is advantageously placed on a conduction layer 5 so as to secure the latter, the assembly then being placed above means 7 for modulating the thermal conductivity and heat extraction means 9 of the heat contained in crucible 2.

Means 7 for modulating the thermal conductivity are fitted between bottom 3 of crucible 2 and heat extraction means 9 and are advantageously located inside a securing support 6. Means 7 for modulating the thermal conductivity advantageously comprise a plurality of plates 10, in a controlled atmosphere, and means for moving these plates designed to enable the plates to be moved towards and away from one another and towards and away from the bottom of crucible 2. The means for moving plates 10 comprise for example a control rod 8 substantially perpendicular to bottom 3 of crucible 2 and situated along a vertical axis passing through the centre of bottom 3 of crucible 2. Control rod 8 can thus move vertically along this vertical axis.

Heat extraction means 9 are for example formed by a heat exchanger advantageously fixed to the top end of control rod 8. The heat exchanger is for example formed by a copper water box for example at a temperature of 27° C.

Securing support 6, situated under crucible 2, is advantageously used to define the maximum gap allowed between each plate and the bottom of crucible 2 and between each of plates 10. Securing support 6 also allows vertical movement of plates 10 between an insulation position in which the distance between the plates is maximum and a conduction position in which the distance between the plates is minimum and predefined by spacers 12. Securing support 6 is achieved by any suitable known means.

In FIG. 1, in a cross-sectional view, securing support 6 comprises vertical external side walls and stepped internal side walls presenting substantially horizontal flat supports 11 of decreasing cross-section from top to bottom. Securing support 6 is therefore more tapered in its top part than in its bottom part. Flat supports 11 define the farthest positions between plates 10 and the bottom of crucible 2, i.e. the insulation position of the different plates. In this configuration, plates 10 have cross-sections of dimensions (lengths and/or widths) that decrease the farther they are from the bottom of crucible 2. Securing support 6 is preferably made of hollow sintered silica. Crucible 2, conduction layer 5 and securing support 6 have substantially the same vertical axis of symmetry.

In general manner, conduction layer 5, heat extraction means 9 and the different plates 10 have the same shape and substantially the same dimensions. The shape and dimensions are themselves very close to those of the crucible and of the ingot to ensure essentially downward and uniformly distributed heat evacuation.

In an alternative embodiment, not shown, internal side walls are oblique delineating an upwardly tapered space for positioning of plates 10.

In FIG. 1, three plates (10a, 10b and 10c), substantially parallel to the bottom of crucible 2, rest on flat supports 11 which thus act as end of travel stops when downward movement of plates 10 takes place. Upward vertical movement of control rod 8 results in vertical movement of the plates from their insulation position to their maximum conduction position in which plates 10 are as close as possible to the bottom of crucible 2.

Conduction layer 5, plates 10 and heat exchanger 9 are preferably in a controlled atmosphere. The latter comprises at least one gas presenting a thermal conductivity that is higher than or equal to a threshold value, for example 0.01 W/m·K. This gas is for example argon or helium.

For example, plates 10 arranged inside securing support 6 are spaced a maximum of 1 mm apart in their insulation position. Advantageously, the space separating heat exchanger 9 and the lowest plate 10a, in the lowest position, is twice the maximum space between two plates 10, i.e. 2 mm.

Plates 10 are rigid and made from a material presenting a thermal conductivity of more than 10 W/m·K, and a low emissivity for example of about 0.15. They are for example made from molybdenum or a molybdenum-based material. They could also be made from tungsten or niobium or, if they have to remain at less high temperatures which is the case of the bottom plates the farthest from the crucible, from Tantalum, Gold, Silver or Nickel. These plates 10 are advantageously polished to reduce their emissivity and present a plurality of protuberances 12 acting as spacers to prevent any contact between two adjacent plates in the conduction position. Protuberances 12 can be placed on the top and/or bottom faces of plates 10. Protuberances 12 are for example small pads of thermally insulating material, for example made from silica. Protuberances 12 can be stuck onto plates 10 or inserted in cavities hollowed out in plates 10. Plates 10 for example present a thickness of about 3 mm and protuberances 12 have a minimum height of about 0.1 mm.

The use of a plurality of plates 10 having a low emissivity enables exchanges by radiation to be greatly reduced. Furthermore, the arrangement of the plates enables small volumes of gas to be worked on rather than a large volume. Transfers by convection are thereby greatly reduced and the thermal resistance of the device can then be reduced to a thermal conduction transfer resistance.

Heating means 13 and lateral insulation means 14 are illustrated schematically in FIG. 1. Heating means 13 are for example of inductive type and are preferably located above and on the sides of crucible 2 to foster agitation by convection in liquid phase. Lateral insulation means 14 are achieved in known manner and ensure that the heat flux to be extracted is unidirectional in the downwards direction and substantially perpendicular to the plane of bottom 3 of crucible 2. In FIG. 1, they totally surround crucible 2, conduction layer 5 and securing support 6.

Device 1 further comprises temperature control means comprising at least three temperature sensors, for example in the form of thermocouples. Two temperature sensors are preferably located along the vertical axis of symmetry of device, a first sensor 15 being located in the top part of bottom 3 of crucible 2 and a second sensor 16 being located in the bottom part of bottom 3 of crucible 2. These two sensors 15, 16 measure the axial thermal gradient in crucible 2. A third sensor 17 is located on the periphery of bottom 3 of crucible 2 and in the top part thereof. Sensors 15 and 17 measure the radial thermal gradient in bottom 3 of crucible 2.

For example, a method for use of the device to produce a crystalline material ingot is described below. The crystalline material is for example silicon, but may also be germanium or any other crystalline material.

In a preferred embodiment, a seed 18 is advantageously placed in the crucible, specifically united to the bottom 3 of the crucible. Seed 18 is for example made from the same material as the feedstock, i.e. from silicon with a thickness of about 1 cm.

A crystalline material feedstock is then placed in crucible 2. This crystalline material is preferably of semi-conductor type, for example silicon. The crystalline material feedstock is then melted by actuation of heating means 13, taking care not to melt seed 18. In this silicon feedstock melting phase (FIG. 1), the device is in an insulation mode, i.e. plates 10 are supported by flat supports 11 of securing support 6. In this configuration, the spacing between the bottom of crucible 3 and plates 10 and between the plates is maximum. Insulation of the crucible from heat exchanger 9 is therefore maximum. Control rod 8 is then in its lowest position, i.e. heat exchanger 9 is in its position farthest away from crucible 2.

During this silicon melting phase, the heating power increases so that the liquefaction front advantageously follows a downward vertical progression towards seed 18. Once the liquefaction front has reached seed 18, the heating power no longer changes. Advantageously, when melting takes place, a thickness of at least 6 mm of gas, for example argon, is maintained between conduction layer 5 and heat exchanger 9.

In an alternative embodiment, silicon 19 can be input directly to the crucible in molten form.

Figure 2:
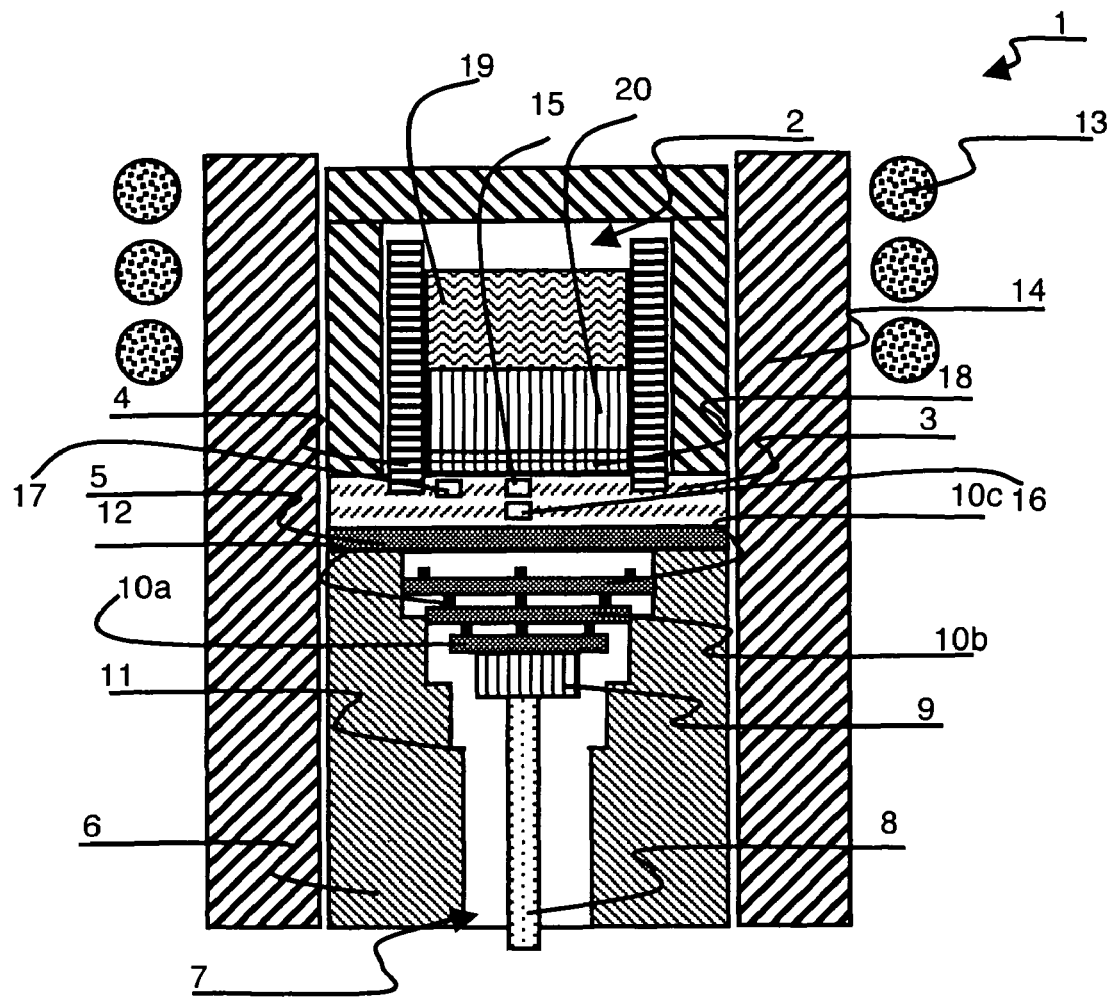

Then, to initiate growth on seed 18, i.e. to reverse the travel direction of the interface between solid silicon 20 and molten silicon 19, the heating power is kept constant and translation of plates 10 begins. In a first stage, control rod 8, previously placed in its bottom position, moves up so as to bring heat exchanger 9 towards first plate 10a, which is the lowest plate. Upward movement of control rod 8 causes heat exchanger 9 to be brought into contact with first plate 10a, followed by vertical movement of this plate 10a. As illustrated in FIG. 2, when upward vertical translation of control rod 8 continues, first plate 10a moves towards second plate 10b with which it comes into contact at the level of protuberances 12. Plates 10 thus move little by little towards crucible 2 until protuberances 12 of last plate 10c come into contact with conduction layer 5.

Translation of control rod 8 and therefore of heat exchanger 9 will enable the thickness of the gas layer arranged between heat exchanger 9 and conduction layer 5 to be modulated. Translation of control rod 8 thereby enables the thermal resistance of device 1 under crucible 2 to be modulated. The number of plates 10 to be fitted to initiate growth varies according to the heat flux to be extracted and to the materials used (and their thicknesses) in device 1. In this way, by moving plates 10 towards bottom 3 of crucible 2, crucible 2 becomes increasingly less insulating and lets a larger heat flux pass than in the melting phase. This approach thereby enables fine and very progressive modifications of the heat flux to be extracted from crucible 2.

From a certain solidification stage of the silicon, a reduction of the heating power can advantageously be coupled with modulation of the thermal conductivity of bottom 3 of crucible 2. In this way, translation of heat exchanger 9 enables a constant heat flux extraction to be kept. Translation reduces the thermal resistance of the device under crucible 2 to compensate the increase of the thermal resistance due to the crystallized and therefore solid part of the silicon.

In the final state, plates 10 will be in the closest position to one another and to conduction layer 5 and the total thickness of gas between plates 10 and between conduction layer 5 and heat exchanger 9 will be minimum. The device is then in a maximum conduction mode.

In an alternative embodiment, if the final gas thickness necessary for extraction of the required heat flux is too small, direct contact between plates 10 can be made possible by eliminating protuberances 12 of plates 10.

Another alternative embodiment consists in changing the gas present between plates 10 inside securing support 6 during the growth phase. If the total gas thickness is too small, a gas presenting a higher thermal conductivity can be used, for example helium. A larger space between conduction layer 5 and heat exchanger 9 can thus be used.

Throughout the silicon crystallisation process, the temperature of first sensor 15 and the temperature difference between first and second sensors 15, 16 will enable the heating power and movement of control rod 8 to be controlled.

The heating power will in fact change throughout the crystallization process so that the temperature measured by first sensor 15 increases linearly in the melting phase, then stabilizes when growth is initiated, and then finally decreases linearly during the solidification into an ingot.

At the same time, the temperature difference between first and second temperature sensors 15, 16 is linked to the movement of control rod 8. Therefore, during the charge melting phase, a temperature difference between temperature sensors 15, 16 lower than a threshold will be sought for, which will be translated by the fact that the device is in insulating mode, i.e. that control rod 8 is in its lowest position. In the crystalline growth initiation phase, the temperature difference between sensors 15, 16 will decrease slowly until it reaches a second threshold value. This decrease translates a heat flux extraction. During solidification, the temperature difference between sensors 15, 16 is kept constant by movement of control rod 8, in spite of the increase of the temperature measured by first sensor 15.

The temperature difference between sensors 15 and 17 is representative of the radial gradient at the bottom of crucible 2 and it enables to check that the flux extracted from the crucible is indeed unidirectional. In this way, monitoring of the radial insulation is performed and information on the shape of the solidification front can be obtained. Isotherms substantially parallel to the bottom of crucible 2 are preferably chosen so as to have solidification perpendicular to the bottom of crucible 2.

As a variant, inhomogeneous heat evacuation can be sought for. If for example heat extraction is preferentially sought for in the centre of crucible 2, plates 10 the farthest from the crucible may present smaller dimensions than the crucible (as in FIG. 1). In this way, a convex solidification front can be obtained.

Figure 3:
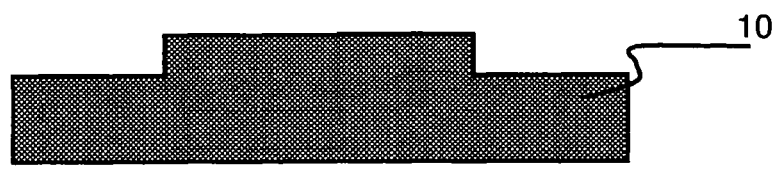
FIG. 3 represents a schematic cross-sectional view of a plate with an additional thickness in the centre.

In another alternative embodiment of the invention, plates 10 present inhomogeneities of thickness. In the case where heat extraction is preferentially sought for in the centre, an additional thickness of material can be used (FIG. 3). The additional thickness can then be achieved by any suitable technique, for example by machining the plate or by sticking additional heat-conducting material.

The geometry of the plates is obviously adapted to obtain the required heat flux distribution.

Figure 4:
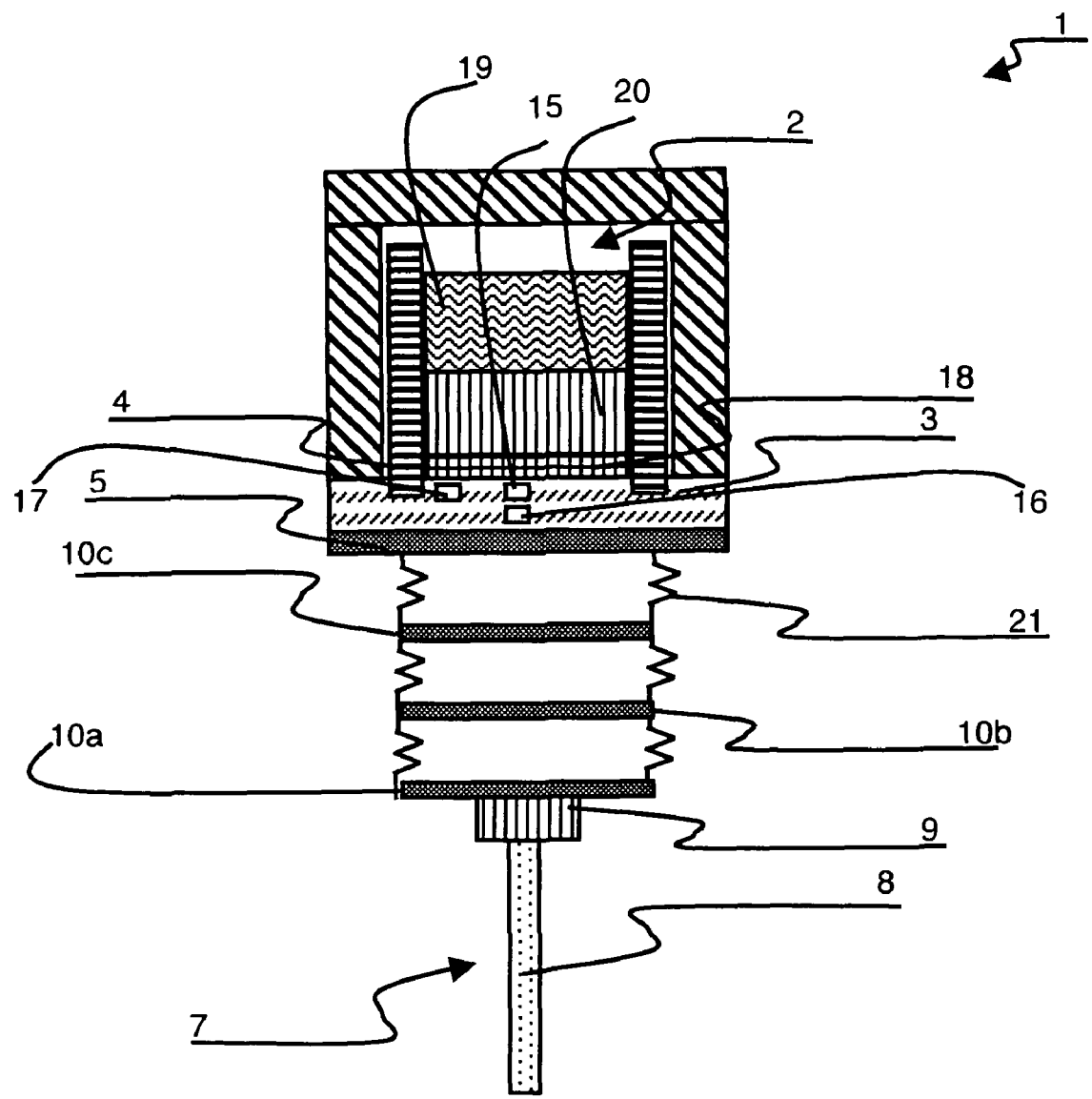
FIG. 4 represents a schematic cross-sectional view of an alternative embodiment of the device.

In another alternative embodiment of the invention illustrated in FIG. 4, plates 10 can be separated by thermally insulating elements 21, for example of spring type, presenting a predefined stiffness. These elements thus enable relative movement of the plates between one another when movement of control rod 8 takes place. Elements 21 are advantageously located on the periphery of plates 10. Elements 21 can then occupy the whole periphery of plates or a plurality of elements are fitted to occupy predefined zones.

Advantageously, elements 21 associated with the plates closest to the crucible present a lower stiffness than the elements associated with the plates that are farthest away.

The invention claimed is:

1. A device for producing a block of crystalline material by solidifying a bath of molten material, the device comprising:
    a crucible having a bottom;
    a heat extractor arranged under the crucible, the heat extractor being movable relative to the crucible;
    first and second plates made from thermally conducting material having an emissivity of less than 0.5, said first and said second plates being parallel to the bottom of the crucible and arranged between the bottom of the crucible and the heat extractor; and
    a moving device configured to move said first and said second plates toward and away from one another and toward and away from the bottom of the crucible to modulate a thermal conductivity between the bottom of the crucible and the heat extractor during the solidifying of the bath of the molten material.

2. The device according to claim 1, wherein the first and the second plates have a thermal conductibility greater than or equal to 10 W/m·K.

3. The device according to claim 1, wherein the first and second plates are made from a molybdenum-based material.

4. The device according to claim 1, wherein one of the first and the second plates comprises:
    a first portion with a first thickness; and
    a second portion with a second thickness, the first and the second thicknesses being measured between first and second faces of each of the first and the second portions that are parallel to the bottom of the crucible, respectively.

5. The device according to claim 1, wherein the crucible and the first and the second plates are disposed inside a chamber comprising at least a gas having a thermal conductivity greater than or equal to 0.01 W/m·K.

6. The device according to claim 5, wherein the gas is helium or argon.

7. The device according to claim 1, wherein the bottom of the crucible comprises a layer made of a material having an emissivity of less than 0.5.

8. The device according to claim 7, wherein the material has a thermal conductivity greater than or equal to 10 W/m·K.

9. The device according to claim 1, wherein the first and the second plates are provided with a protuberance made of thermally insulating material forming a spacer between the first and the second plates.

10. The device according to claim 1, wherein the moving device comprises a control rod integral to the heat extractor, the moving device being configured to move the first and the second plates toward and away from one another and toward and away from the bottom of the crucible.

11. The device according to claim 1, wherein a bottom of the crucible is leak proof.

12. The device according to claim 1, wherein the moving device is configured to move the first and the second plates toward and away from the bottom of the heat extractor.

13. The device according to claim 1, wherein the crucible is supported by a supporting element, the supporting element comprising a first end of travel stop for the first plate and a second end of travel stop for the second plate.

14. The device according to claim 1, wherein
    a third plate made from a thermally conducting material having an emissivity of less than 0.5 and parallel to the bottom of the crucible, and
    the third plate being arranged between a bottom of the first and the second plates and the heat extractor, the second plate separating the first plate from the third plate.

15. The device according to claim 1, wherein the moving device is configured to move the first and the second plates from a first position where the first and the second plates are separated from the heat exchanger and from the crucible to a second position.

16. The device according to claim 15, wherein the first and the second plates are connected to the heat exchanger and to the crucible in the second position.

17. The device according to claim 14, comprising
    a first spring with a first stiffness connecting the first plate to the second plate; and
    a second spring with a second stiffness connecting the second plate to the third plate, the second stiffness being greater than the first stiffness.

* * * * *